United States Patent

Lin

[11] Patent Number: 6,001,679
[45] Date of Patent: Dec. 14, 1999

[54] METHOD FOR MANUFACTURING POLYSILICON LOAD

[75] Inventor: Han Lin, Hsinchu, Taiwan

[73] Assignee: United Microelectronics Corp., Hsinchu, Taiwan

[21] Appl. No.: 09/010,853

[22] Filed: Jan. 22, 1998

[30] Foreign Application Priority Data

Oct. 27, 1997 [TW] Taiwan ................................. 86115831

[51] Int. Cl.⁶ .............................................. H01L 21/8244
[52] U.S. Cl. ............................................ 438/238; 438/264
[58] Field of Search ................................... 438/238–241, 438/263–264, 381

[56] References Cited

U.S. PATENT DOCUMENTS 5,605,853 2/1997 Yoo et al. ............................... 438/238
5,770,497 6/1998 Wu et al. ............................... 438/238

*Primary Examiner*—Jey Tsai
*Attorney, Agent, or Firm*—Rabin & Champagne, P.C.

[57] ABSTRACT

A method for manufacturing SRAM polysilicon loads that utilizes a silicon dioxide layer formed between an interconnect and a load as barrier in preventing the out-diffusion of heavily doped impurities into the lightly doped or undoped polysilicon load. Hence, the effective length and the resistance of the polysilicon load can be maintained, and the dimensions of SRAM devices can be further reduced. Furthermore, the prevention of out-diffusion from a heavily doped interconnect region into a lightly doped load region serves to maintain the electrical conductivity of interconnects. Therefore, SRAM device fabrication is more easily controlled, and product reliability can be increased.

19 Claims, 4 Drawing Sheets

METHOD FOR MANUFACTURING POLYSILICON LOAD

CROSS-REFERENCE TO RELATED APPLICATION

This application claims the priority benefit of Taiwan application serial no. 86115831, filed Oct. 27, 1997, the full disclosure of which is incorporated herein by reference.

BACKGROUND OF THE INVENTION

1. Field of Invention

The present invention relates to a method for manufacturing integrated circuits. More particularly, the present invention relates to a method for manufacturing polysilicon load of a static random access memory (SRAM) that facilitates the reduction of device dimensions and an increase in the level of integration.

2. Description of Related Art

Static random access memories (SRAMs) are now extensively used in integrated circuits, especially in the telecommunication and electronic industries. Therefore, how to reduce device dimensions, how to increase the level of integration without compromising the quality are some of the major goals in the production industry. Polysilicon loads are one of the basic elements in a SRAM cell. The polysilicon loads serve as resistor in the circuit, which are normally formed by doping very low concentration of ions or not doping ions on a line segment of a polysilicon line. On the other hand, interconnects are formed on the same polysilicon lines by specifically doping a heavier concentration of ions on a particular line segment.

FIG. 1 is a circuit layout diagram of a conventional four-transistor static random access memory (4T SRAM). As shown in FIG. 1, $R_1$ and $R_2$ are load resistors, and $M_1$ and $M_2$ are enhancement mode NMOS transistors that function as drivers. Furthermore, enhancement mode NMOS $M_3$ and $M_4$ are used for accessing data contained in the SRAM. The gates of transistor $M_3$ and $M_4$ are controlled by a horizontal conductive line referred to as a word line (WL). The source terminals of $M_3$ and $M_4$ are connected to transistor drivers $M_1$ and $M_2$, respectively. Therefore, the ON and OFF state of the transistors $M_1$ and $M_2$ are closely related to the switching states of transistors $M_3$ and $M_4$. The source terminals of $M_3$ and $M_4$ are each connected to a vertical conducting line referred to as a bit line (BL).

In general, for the 4T SRAM, the same polysilicon layer is used to form interconnects and loads. To form an interconnect, the desired segment on the polysilicon line is heavily doped, and to form a load, the desired segment on the polysilicon line is lightly doped or not doped at all. Since the loads and the interconnects are formed on the same polysilicon lines in a conventional production method, thickness of both the interconnect lines and the load lines are almost the same.

FIG. 2 is a cross-sectional view showing a conventional polysilicon load structure. As shown in FIG. 2, a gate polysilicon element 12 and a power line polysilicon element 14 is formed over a substrate 10. Then, an insulating layer 16 is deposited over the substrate 10. This is followed by etching the insulating layer 16 to form contact window 17a that exposes the gate polysilicon element 12, and contact window 17b that exposes the power line polysilicon element 14. Thereafter, a polysilicon layer is formed over the insulating layer 16 and into the contact windows 17a and 17b. Subsequently, an ion doping operation using a low ion concentration level is performed to form a polysilicon load line in segment 18. Next, a second ion doping operation is performed, this times using a higher ion concentration level to form the interconnects in area 20a and 20b.

In general, the conventional method of producing a high load resistance is by decreasing the thickness of polysilicon layer, increasing the length of the polysilicon load line, or reducing the width of the polysilicon load line. However, when the SRAM cells are further miniaturized, the aforementioned method of using the same polysilicon layer to fabricate interconnects and loads by variation the doping concentrations on different polysilicon line segments in two doping operations becomes infeasible. The main reason is that during subsequent thermal processing operations, the large amount of doped impurities from the second implant will out-diffuse from the interconnects and reduce the effective length of the polysilicon load line. Thus, the resistance of the load line will be lowered and the current flow in them will increase. Furthermore, the diffusion of ions will lead to difficulties in controlling the quality of the product. This is an especially difficult problem for the conventional method. Because, if we want to extend the length of the polysilicon load line, there is no more space due to the miniaturization of memory cells. On the other hand, if the load resistance is increased through reducing the width of a polysilicon load line, it is difficult to avoid increasing the resistance of the interconnect as well. This is because the interconnects and the loads are formed along the same polysilicon line. Therefore, the conventional method of forming the polysilicon load line is a major limitation for the miniaturization of the memory cells.

In light of the foregoing, there is a need in the art to provide an improved method of manufacturing polysilicon load for SRAM cells.

SUMMARY OF THE INVENTION

Accordingly, the present invention is directed to provide a method for manufacturing SRAM polysilicon loads that utilizes the silicon dioxide layers formed at both ends of a polysilicon load as barrier in preventing the out-diffusion of heavily doped impurities into the polysilicon load. Hence, the effective length and the resistance of the polysilicon load can be maintained, and the dimensions of SRAM devices can be further reduced. Furthermore, the prevention of out-diffusion from a heavily doped interconnect region to a lightly doped or undoped load region serves to maintain the electrical conductivity of interconnect. Therefore, SRAM device fabrication is more easily controlled, and product reliability can be increased.

To achieve these and other advantages and in accordance with the purpose of the invention, as embodied and broadly described herein, the invention provides a method for forming SRAM polysilicon loads. The method comprises the steps of providing a substrate having a device region already formed thereon. Next, an inter-polysilicon dielectric layer is formed over the substrate and the dielectric layer. Then, the inter-polysilicon dielectric layer is patterned with masks to form a via that leads to the polysilicon layer of the device region. Thereafter, a heavily doped polysilicon material is deposited into the via to form a first interconnect. Subsequently, a thin layer of silicon dioxide is deposited or grown over the first interconnect, and then a lightly doped or undoped polysilicon layer is formed above the first interconnect functioning as a load. Thereafter, an upper dielectric layer is formed over the polysilicon load and the inter-polysilicon dielectric layer. The upper dielectric layer is then patterned with a mask to form an opening exposing the polysilicon load. A second silicon dioxide layer is then deposited or grown over the polysilicon load and at the bottom of the opening. Finally, a heavily doped polysilicon is deposited into the opening to form a second interconnect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
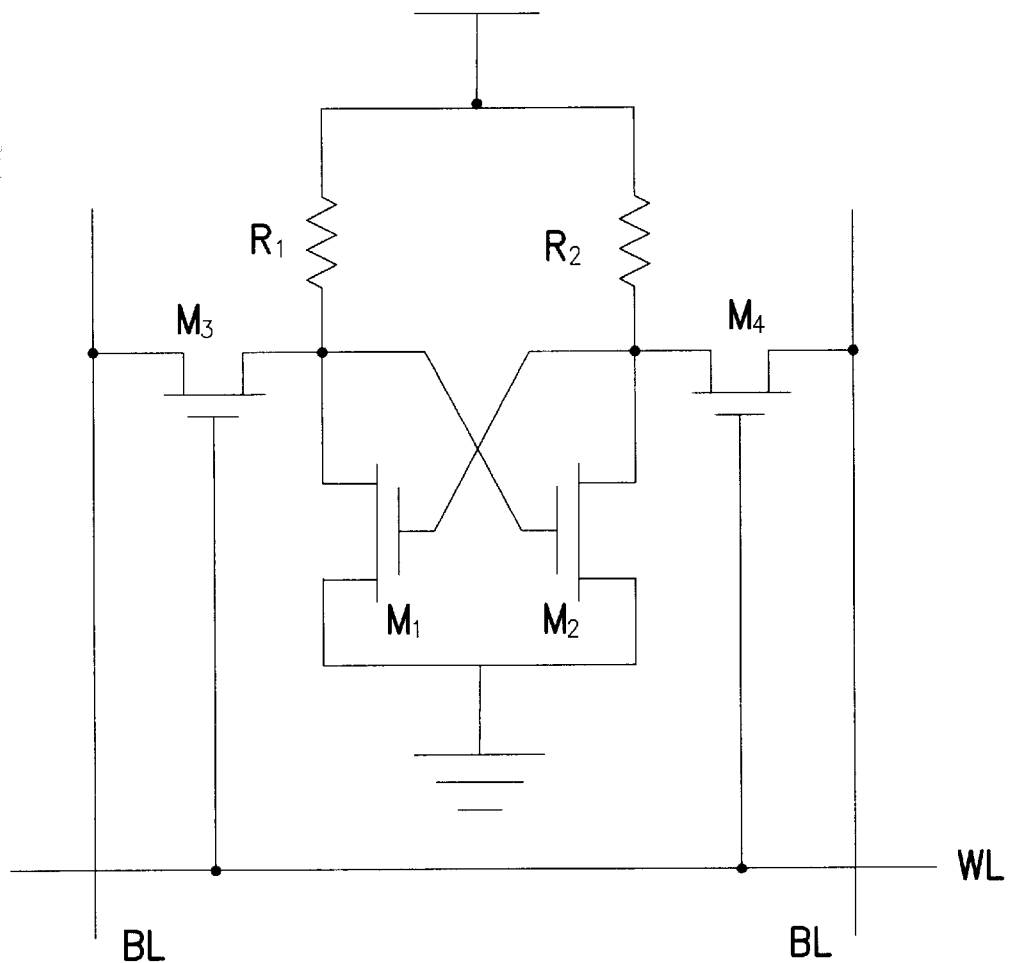
FIG. 1 is a circuit layout diagram of a conventional four-transistor static random access memory (4T SRAM)
Figure 2:
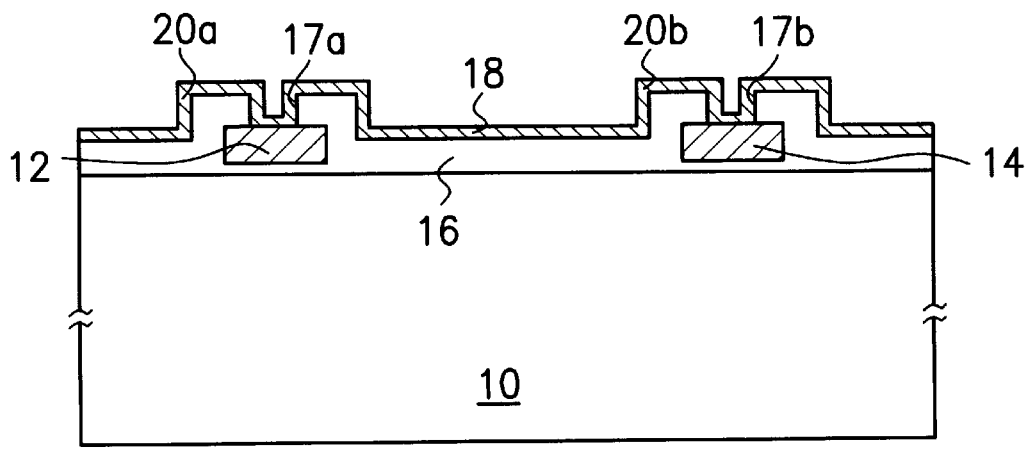
FIG. 2 is a cross-sectional view showing a conventional polysilicon load structure.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
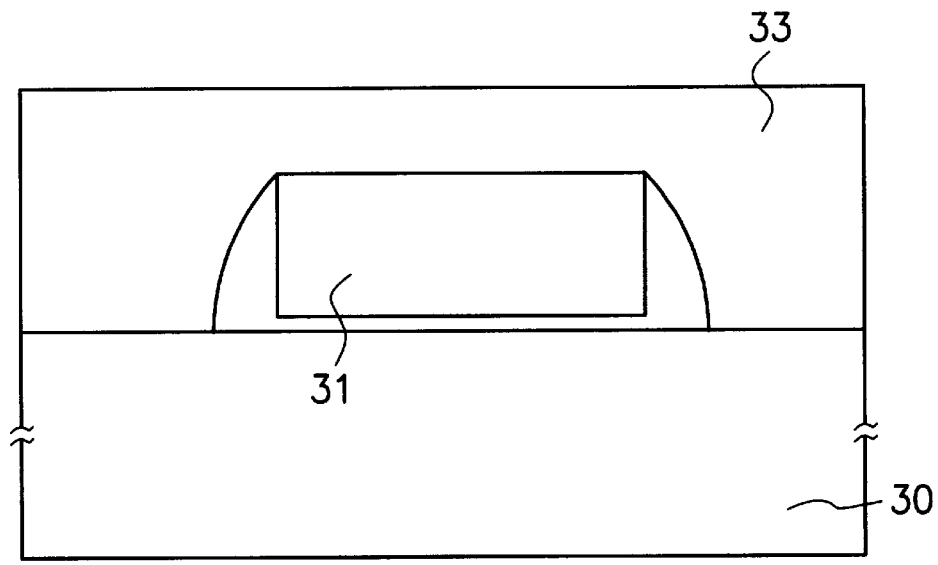
FIGS. 3A through 3F are cross-sectional views showing the progression of manufacturing steps in producing load lines having silicon dioxide as a barrier layer according to one preferred embodiment of this invention.

FIGS. 3A through 3F are cross-sectional views showing the progression of manufacturing steps in producing load lines having silicon dioxide as a barrier layer (tunneling oxide) according to one preferred embodiment of this invention. First, as shown in FIG. 3A, a substrate 30 having a device region already formed thereon is provided. The device region includes a polysilicon layer 31. Then, a first inter-polysilicon dielectric layer 33 is formed over the substrate 30 covering the device region.

Figure 3B:
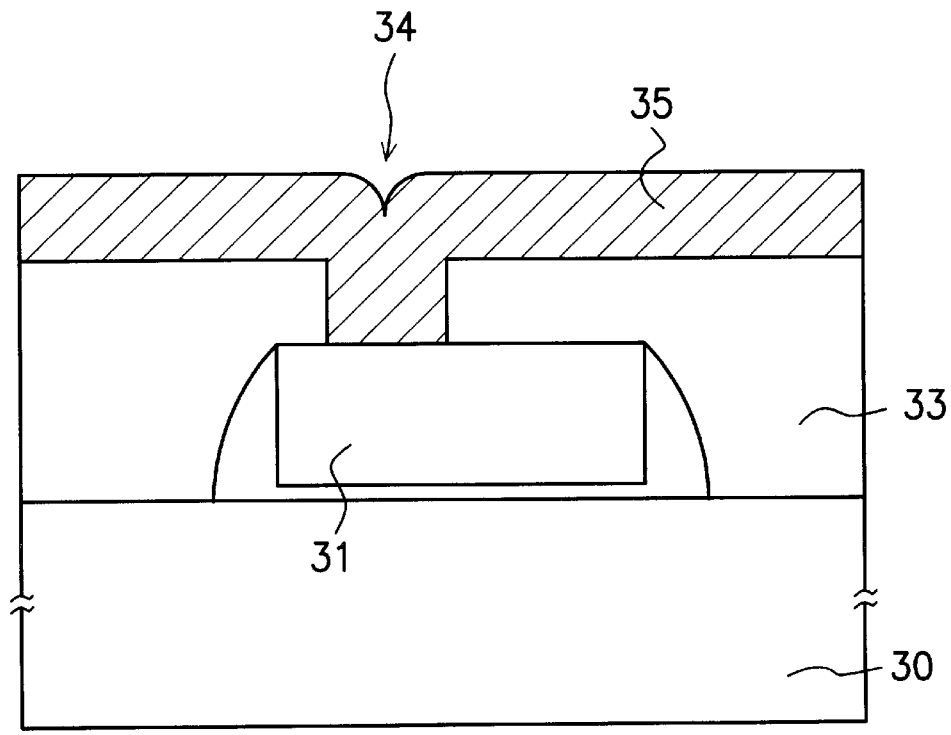

Next, as shown in FIG. 3B, a photoresist layer is formed over the first inter-polysilicon dielectric layer 33, and then a patterned is created in the photoresist layer. Thereafter, using the photoresist layer as a mask, a via 34 is formed by an etching away a portion of the first inter-polysilicon dielectric layer 33 exposing the polysilicon layer 31. Subsequently, the photoresist layer is removed. Then, a first heavily doped polysilicon layer 35 is deposited over the first inter-polysilicon dielectric layer 33 and into the via 34.

Figure 3C:
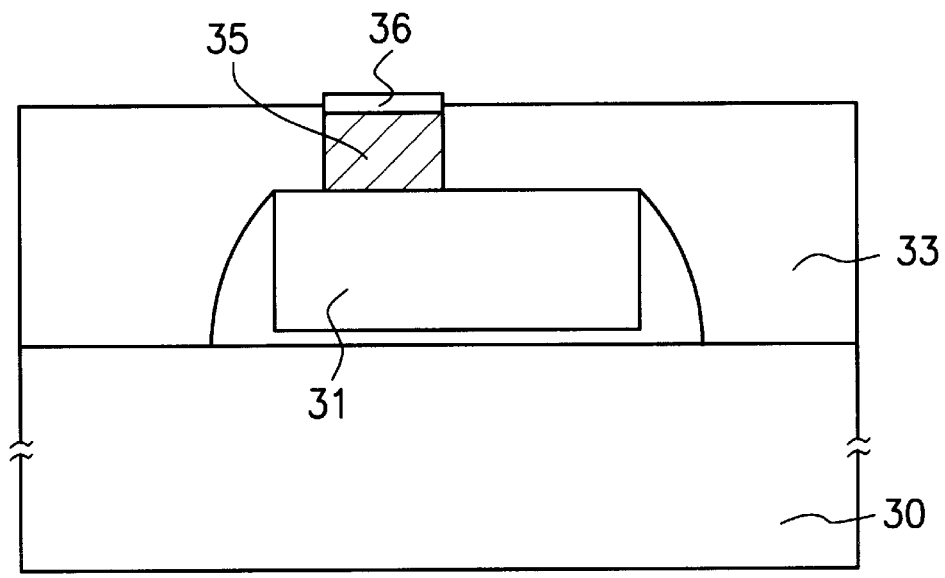

Thereafter, as shown in FIG. 3C, the portion of the first heavily doped polysilicon layer 35 outside the via 34 is removed. The method of removing portions of the first heavily doped polysilicon layer 35 includes using an etching back method or a chemical-mechanical polishing (CMP) operation. Next, a thin layer of first tunneling oxide 36 having a thickness preferably of about 10 Å to 40 Å is formed over the first heavily doped polysilicon layer 35. The method of forming the first silicon dioxide layer includes using a rapid thermal oxidation (RTO) method. Alternately, the rapid thermal oxidation is preferably carried out right after an additional step of removing the native oxide layer formed over the first heavily doped polysilicon layer 35 is completed.

Figure 3D:
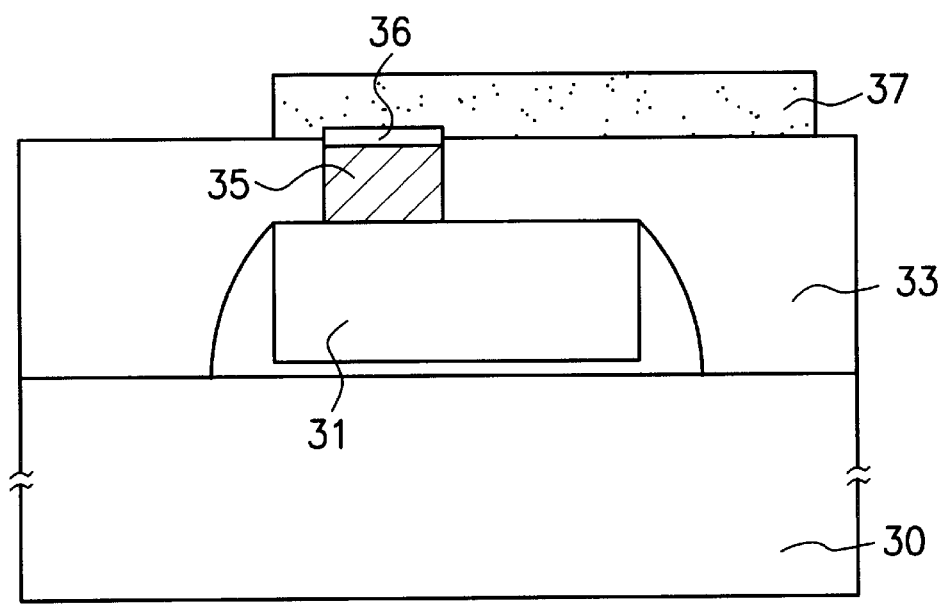

Next, as shown in FIG. 3D, a lightly doped or undoped polysilicon layer 37 is formed over the first tunneling oxide layer 36 and portions of the first inter-polysilicon dielectric layer 33.

Figure 3E:
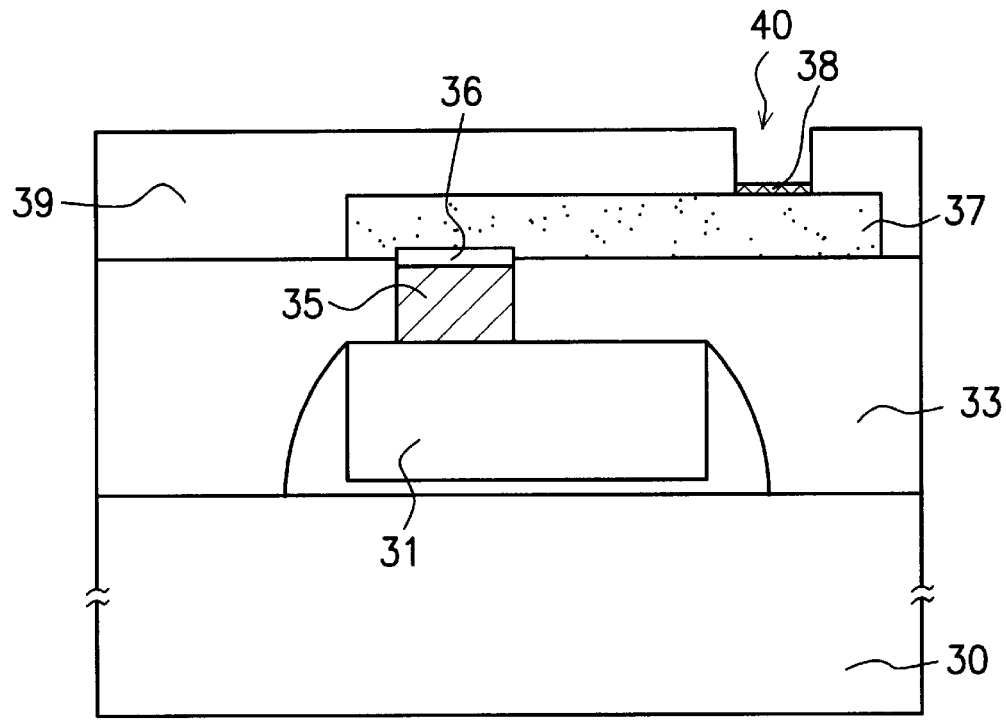

Next, as shown in FIG. 3E, a second inter-polysilicon dielectric layer 39 is formed over the structure of FIG. 3D. Thereafter, a photoresist layer is formed over the second inter-polysilicon dielectric layer 39, and then a mask pattern is created on the photoresist layer to define the location of an opening 40. Subsequently, a portion of the second inter-polysilicon dielectric layer 39 is etched to expose the polysilicon layer 37, and the photoresist layer is removed. A second tunneling oxide layer 38 having a thickness preferably of about 10 Å to 40 Å is then formed over the lightly doped or undoped polysilicon layer 37 and at the bottom of the opening 40 using a rapid thermal oxidation method. Similarly, the rapid thermal oxidation is preferably carried out right after an additional step of removing the native oxide layer that forms over the first lightly doped or undoped polysilicon layer 37 is completed.

Figure 3F:
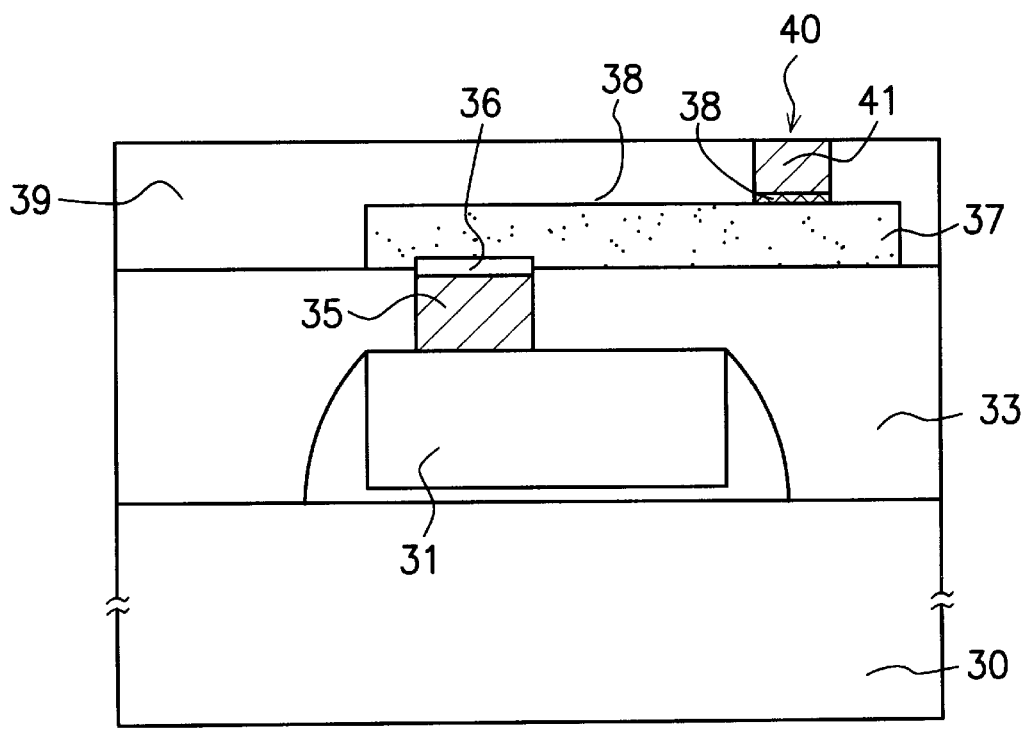

Next, as shown in FIG. 3F, a second heavily doped polysilicon layer 41 is formed over the structure of FIG. 3E. Then, a layer of the second heavily doped polysilicon layer 41 outside the opening 40 is removed. The method of removing the second heavily doped polysilicon layer 41 includes using an etching back method or a chemical-mechanical polishing method. Therefore, as a summary, this invention makes use of two heavily doped polysilicon layers as interconnects, and a lightly doped or undoped polysilicon layer as a load. In addition, there are silicon dioxide layers at each terminal of the load functioning as barrier, which is capable of preventing the out-diffusion of ions from the heavily doped interconnect regions into the lightly doped load region. Hence, the effective length and the resistance of the load can be maintained, while the electrical conductivity of the interconnects remain unchanged.

The first characteristic of this invention is the utilization of two ultra-thin silicon dioxide layers formed at both ends of a polysilicon load to function as barrier in preventing the out-diffusion of heavily doped impurities into the polysilicon load. Therefore, the effective length and the resistance of the polysilicon load can be maintained, and the dimensions of SRAM devices can be further reduced.

Another characteristic of this invention is that the prevention of out-diffusion of ions from the heavily doped interconnect regions into the load region by the silicon dioxide barrier layer helps to preserve the electrical conductivity of the interconnects. Therefore, the fabrication of SRAM devices is more easily controlled, and product reliability can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a polysilicon load comprising the steps of:

providing a substrate having at least one device region already formed thereon;

forming a first inter-polysilicon dielectric layer over the substrate;

patterning with masks to form a via exposing the device region;

forming a first heavily doped polysilicon layer over the first inter-polysilicon dielectric layer and the interior of the via;

removing a portion of the first heavily doped polysilicon layer that lies outside the via;

forming a first silicon dioxide layer over first heavily doped polysilicon layer;

forming a lightly doped polysilicon layer over the first silicon dioxide and portions of the first inter-polysilicon dielectric layer;

forming a second inter-polysilicon dielectric layer over the lightly doped polysilicon layer and the first inter-polysilicon dielectric layer;

patterning the second inter-polysilicon dielectric layer with a mask to form an opening exposing a portion of the lightly doped polysilicon layer;

forming a second silicon dioxide over the exposed lightly doped polysilicon layer, that is, at the bottom of the opening;

forming a second heavily doped polysilicon layer over the second inter-polysilicon dielectric layer and the interior of the opening; and removing a portion of the second heavily doped polysilicon layer that lies outside the opening.

2. The method of claim 1, wherein the device region comprises a polysilicon layer.

3. The method of claim 1, wherein the device region comprises a polysilicon layer and a dielectric layer.

4. The method of claim 1, wherein the step of removing a portion of the first heavily doped polysilicon layer that lies outside the via includes using an etching back method.

5. The method of claim 1, wherein the step of removing a portion of the first heavily doped polysilicon layer that lies outside the via includes using a chemical-mechanical polishing method.

6. The method of claim 1, wherein the first silicon dioxide preferably has a thickness of about 10 Å to 40 Å.

7. The method of claim 1, wherein the second silicon dioxide preferably has a thickness of about 10 Å to 40 Å.

8. The method of claim 1, wherein the step of removing a portion of the second heavily doped polysilicon layer that lies outside the opening includes using an etching back method.

9. The method of claim 1, wherein the step of removing a portion of the second heavily doped polysilicon layer that lies outside the opening includes using a chemical-mechanical polishing method.

10. A method for manufacturing SRAM polysilicon loads comprising the steps of:

providing a substrate having at least one device region already formed thereon;

forming a first inter-polysilicon dielectric layer over the substrate;

forming a first photoresist layer over the first inter-polysilicon dielectric layer;

patterning the first photoresist layer to form a mask, then removing a portion of the first inter-polysilicon dielectric layer to form a via exposing the device region;

removing the first photoresist layer;

forming a first heavily doped polysilicon layer over the first inter-polysilicon dielectric layer and the interior of the via;

removing a portion of the first heavily doped polysilicon layer that lies outside the via;

forming a first silicon dioxide layer over first heavily doped polysilicon layer;

forming a lightly doped polysilicon layer over the first silicon dioxide and portions of the first inter-polysilicon dielectric layer;

forming a second inter-polysilicon dielectric layer over the lightly doped polysilicon layer and the first inter-polysilicon dielectric layer;

forming a second photoresist layer over the second inter-polysilicon dielectric layer;

patterning the second photoresist layer to form a mask, then removing a portion of the second inter-polysilicon dielectric layer to form a via exposing the device region;

removing the second photoresist layer;

forming a second silicon dioxide at the bottom of the via;

forming a second heavily doped polysilicon layer over the second inter-polysilicon dielectric layer and the interior of the opening; and removing a portion of the second heavily doped polysilicon layer that lies outside the opening.

11. The method of claim 10, wherein the device region comprises a polysilicon layer.

12. The method of claim 10, wherein the device region comprises a polysilicon layer and a dielectric layer.

13. The method of claim 10, wherein the step of removing a portion of the first heavily doped polysilicon layer that lies outside the via includes using an etching back method.

14. The method of claim 10, wherein the step of removing a portion of the first heavily doped polysilicon layer that lies outside the via includes using a chemical-mechanical polishing method.

15. The method of claim 10, wherein the first silicon dioxide preferably has a thickness of about 10 Å to 40 Å.

16. The method of claim 10, wherein the second silicon dioxide preferably has a thickness of about 10 Å to 40 Å.

17. The method of claim 10, wherein the step of removing a portion of the second heavily doped polysilicon layer that lies outside the opening includes using an etching back method.

18. The method of claim 10, wherein the step of removing a portion of the second heavily doped polysilicon layer that lies outside the opening includes using a chemical-mechanical polishing method.

19. The method of claim 10, wherein the step of forming a lightly doped polysilicon layer over the first silicon dioxide layer and portions of the first inter-polysilicon dielectric layer includes forming an undoped polysilicon layer.

* * * * *